(12) United States Patent
Holbrook

(10) Patent No.: US 7,798,833 B2
(45) Date of Patent: Sep. 21, 2010

(54) LOW INDUCTANCE BUSBAR ASSEMBLY

(75) Inventor: Meghan Ann Holbrook, Manhattan Beach, CA (US)

(73) Assignee: GM Global Technology Operations, Inc., Detroit, MI (US)

( * ) Notice: Subject to any disclaimer, the term of this patent is extended or adjusted under 35 U.S.C. 154(b) by 17 days.

(21) Appl. No.: 12/352,983

(22) Filed: Jan. 13, 2009

(65) Prior Publication Data

US 2010/0178813 A1 Jul. 15, 2010

(51) Int. Cl.
 *H01R 4/60* (2006.01)
(52) U.S. Cl. .................. 439/212; 361/355; 174/72 B
(58) Field of Classification Search .......... 439/212; 361/648, 650, 624, 355; 174/72 B
See application file for complete search history.

(56) References Cited

U.S. PATENT DOCUMENTS

| | | | | |
|---|---|---|---|---|
| 3,693,137 A * | 9/1972 | Brumfield | ............... | 439/814 |
| 4,030,794 A * | 6/1977 | Rozenboom et al. | ........ | 439/213 |
| 4,842,533 A * | 6/1989 | Beberman et al. | ........... | 439/213 |
| 4,867,696 A * | 9/1989 | Demler et al. | .............. | 439/212 |
| 4,886,468 A * | 12/1989 | Harton et al. | ............... | 439/212 |
| 4,886,940 A * | 12/1989 | Gagnon et al. | ............ | 174/88 B |
| 5,032,092 A * | 7/1991 | Linn | ..................... | 439/723 |
| 5,132,896 A * | 7/1992 | Nishizawa et al. | ........ | 363/144 |
| 5,184,280 A * | 2/1993 | Fouad | ..................... | 361/648 |
| 5,244,423 A * | 9/1993 | Erickson et al. | ........... | 439/798 |
| 6,024,589 A * | 2/2000 | Hahn et al. | ................. | 439/212 |
| 6,061,230 A * | 5/2000 | Mazzella et al. | ........... | 361/627 |
| 6,066,006 A * | 5/2000 | Shaw | ..................... | 439/736 |
| 6,506,068 B2 * | 1/2003 | Wagener | .................... | 439/213 |
| 6,629,854 B2 * | 10/2003 | Murakami | .................. | 439/251 |
| 6,955,482 B2 * | 10/2005 | Rosenberg et al. | ........... | 385/92 |
| 7,102,256 B2 * | 9/2006 | Murakami | ................. | 307/147 |
| 2006/0128197 A1 * | 6/2006 | McGowan et al. | ........ | 439/212 |

* cited by examiner

*Primary Examiner*—T C Patel
*Assistant Examiner*—Harshad C Patel
(74) *Attorney, Agent, or Firm*—Ingrassia Fisher & Lorenz, P.C.

(57) ABSTRACT

A busbar assembly for electrically coupling first and second busbars to first and second contacts, respectively, on a power module is provided. The assembly comprises a first terminal integrally formed with the first busbar, a second terminal integrally formed with the second busbar and overlapping the first terminal, a first bridge electrode having a first tab electrically coupled to the first terminal and overlapping the first and second terminals, and a second tab electrically coupled to the first contact, a second bridge electrode having a third tab electrically coupled to the second terminal, and overlapping the first and second terminals and the first tab, and a fourth tab electrically coupled to the second contact, and a fastener configured to couple the first tab to the first terminal, and the third tab to the second terminal.

19 Claims, 3 Drawing Sheets

LOW INDUCTANCE BUSBAR ASSEMBLY

This invention was made with Government support under DE-FC26-07NT43123 awarded by US-Department of Energy. The Government has certain rights in this invention.

TECHNICAL FIELD

The present invention generally relates to automotive busbar systems, and more particularly relates to low inductance busbar assemblies for an automotive busbar system.

BACKGROUND OF THE INVENTION

Electric and hybrid electric vehicles often use sources of high voltage such as battery packs or fuel cells that deliver direct current (DC) to drive vehicle motors, electric traction systems, and other vehicle systems. These systems typically include power inverters to convert the DC input from the power source to a 3-phase alternating current (AC) output compatible with electric motors and other electrical components. Such inverters generally include both power and capacitor modules interconnected by a bipolar busbar system that distributes current throughout the inverter. Such busbar systems often involve two or more intricately designed busbars or busbar electrodes that overlap for most of the area of the busbar system.

Moreover, some conventional inverters have been observed to incur voltage spikes when currents flowing through the power module abruptly change, such as when the inverter is switched on or off. The magnitudes of these voltage spikes are related, at least in part, to the inductance of the busbar. More particularly, the relationship between inductance (L), current (i), voltage (V), and time (t) is described in equation (1):

$$V=L*(di/dt) \qquad (1)$$

This equation demonstrates that voltage spikes are intensified for systems that have a high inherent inductance. That is, even relatively small changes in current can produce relatively large voltage spikes if the inductance is high. A busbar system may contribute substantially to the total inductance of an inverter system because of the relatively long current pathway between its various input and output terminals.

Many busbar design factors such as the amount of overlap between positive and negative electrodes can affect the inductance of a busbar system. Because current flows in opposing directions in each electrode, this overlap effectively reduces the overall inductance of the busbar. As a result, many busbar system designs include positive and negative electrodes configured as a laminar structure electrically separated by a non-conducting layer. While these designs offer an overlapped current pathway for the majority of area on a busbar system, the interconnecting elements that transfer current from a primary busbar to a connected subsystem, such as a power module, have non-overlapping components. Accordingly, the contribution of such elements to overall system inductance can be significant. Further, connector terminals on each electrode are typically separated from each other and thus require separate fasteners. While such separation helps to prevent shorting between electrodes, part count and assembly complexity are both increased as a result.

Accordingly, it is desirable to provide a low inductance busbar assembly that reduces voltage spikes when power modules are switched on or off. Further, it is also desirable if such a busbar assembly has a reduced part count and material cost, and is simpler to assemble. Furthermore, other desirable features and characteristics of the present invention will become apparent from the subsequent detailed description and the appended claims, taken in conjunction with the accompanying drawings and the foregoing technical field and background.

SUMMARY OF THE INVENTION

According to various embodiments, a busbar assembly for electrically coupling first and second busbars to first and second contacts, respectively, on a power module is provided. The assembly comprises a first terminal integrally formed with the first busbar, and a second terminal integrally formed with the second busbar, wherein the first and second terminals are configured to overlap each other. The assembly also comprises a first bridge electrode having a first tab electrically coupled to the first terminal, and a second tab electrically coupled to the first contact, the first tab configured to overlap the first and second terminals. The assembly further comprises a second bridge electrode having a third tab electrically coupled to the second terminal, and a fourth tab electrically coupled to the second contact, the third tab configured to overlap with the first and second terminals and the first tab, and a fastener configured to couple the first tab to the first terminal, and the third tab to the second terminal.

DESCRIPTION OF THE DRAWINGS

The present invention will hereinafter be described in conjunction with the following drawing figures, wherein like numerals denote like elements, and.

DESCRIPTION OF AN EXEMPLARY EMBODIMENT

The various embodiments of the present invention described herein provide a connector assembly for a busbar system having a reduced inductance and that is connected to a primary busbar assembly with a single fastener. The connector assembly includes two substantially overlapping, conductive, and electrically isolated bridge electrodes, each electrode configured to electrically couple a positive or negative electrode of the primary busbar assembly to a power module input contact of like polarity. Each bridge electrode has a connecting tab configured to electrically couple to one of two (positive or negative) overlapping terminal tabs on the primary assembly. The connecting and terminal tabs are configured to all overlap each other at a single junction and be secured using a single fastener. The fastener is configured with a non-conducting sleeve that, along with an insulating layer disposed between busbar electrodes, maintains electrical isolation between positively and negatively charged components. The overlapped tabs result in an increased overlapping of current pathways between busbar electrodes and power module contacts that effectively reduces busbar system inductance. Further, part count is reduced over previous designs because of the need for only a single common fastener.

Figure 1:
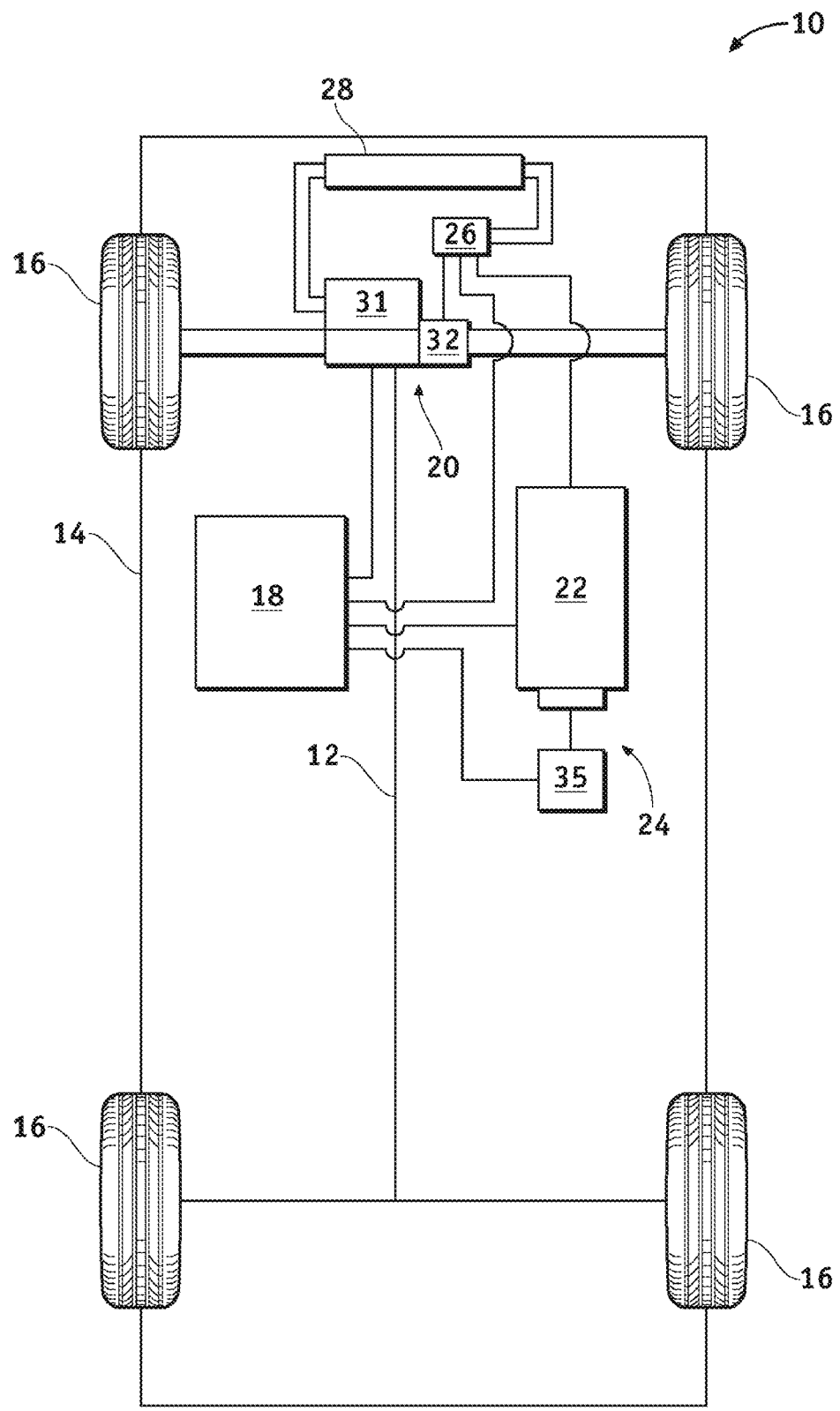
FIG. 1 is a schematic view of an exemplary vehicle illustrating the manner in which a power inverter having an exemplary connector assembly is integrated with various sub-components of the vehicle.

FIG. 1 illustrates a vehicle 10, such as an automobile according to one embodiment of the present invention. Vehicle 10 includes a chassis 12, a body 14, four wheels 16, and an electronic control system (or electronic control unit (ECU)) 18. The body 14 is arranged on the chassis 12 and substantially encloses the other components of the automobile 10. The body 14 and the chassis 12 may jointly form a frame. The wheels 16 are each rotationally coupled to the chassis 12 near a respective corner of the body 14.

Vehicle 10 may be any one of a number of different types of automobiles, such as, for example, a sedan, a wagon, a truck, or a sport utility vehicle (SUV), and may be two-wheel drive (2WD) (i.e., rear-wheel drive or front-wheel drive), four-wheel drive (4WD), or all-wheel drive (AWD). Vehicle 10 may also incorporate any one of, or combination of, a number of different types of engines (or actuators), such as, for example, a gasoline or diesel fueled combustion engine, a "flex fuel vehicle" (FFV) engine (i.e., using a mixture of gasoline and alcohol), a gaseous compound (e.g., hydrogen and/or natural gas) fueled engine, or a fuel cell, a combustion/electric motor hybrid engine, and an electric motor.

In the exemplary embodiment illustrated in FIG. 1, vehicle 10 is a hybrid vehicle that further includes an actuator assembly (or powertrain) 20, a battery 22, a battery state of charge (SOC) system 24, a power inverter assembly 26, a state of charge (SOC) module 35, and a radiator 28. The actuator assembly 20 suitably includes an internal combustion engine 31 and an electric motor/generator (or motor) system (or assembly) 32. The battery 22 is electrically connected to the power inverter assembly 26 and, in one embodiment, is a lithium ion (Li-ion) battery including any number of cells, as is commonly used.

Typically, a power inverter includes a power busbar assembly that has at least one busbar for providing a conductive pathway for current flow between associated electronic components such as a DC source, a capacitor assembly including a capacitor busbar assembly, and a power module assembly. Power and capacitor busbar assemblies typically have a laminar structure or the like that includes overlapping positive and negative electrically conducting outer electrode layers or busbars that are insulated from each other by a non-conducting central layer. These busbar assemblies may be configured as desired to compactly fit between capacitor and power module assemblies and to shorten the current pathway between these components to minimize the overall system inductance.

Figure 2:
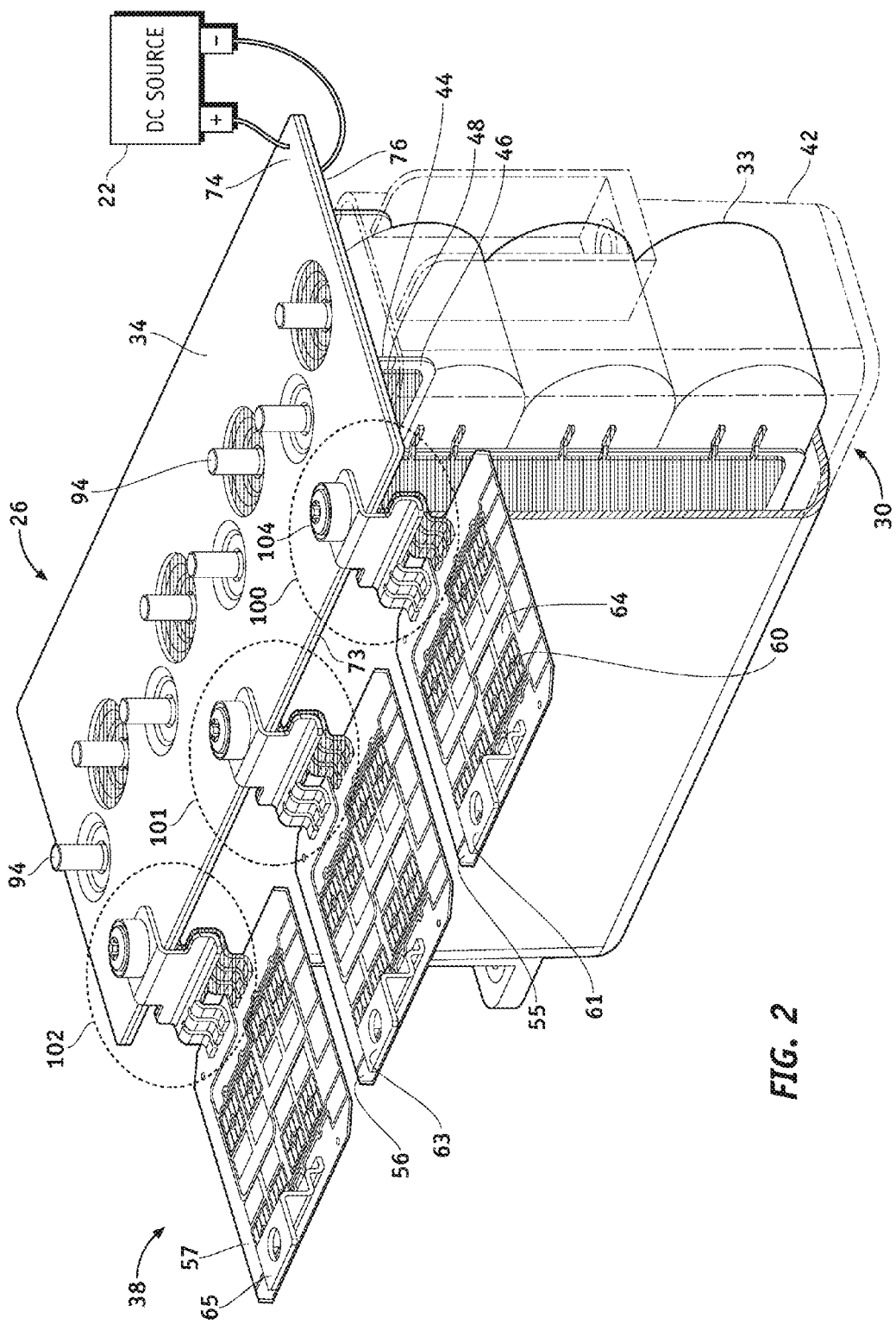
FIG. 2 is a isometric view of a vehicular power inverter assembly depicted in FIG. 1 having a low inductance, single-fastener connector assembly in accordance with an exemplary embodiment.

FIG. 2 is a schematic drawing illustrating selected components of power inverter assembly 26 for use in vehicle 10 shown in FIG. 1 in accordance with a first exemplary embodiment. Power inverter assembly 26 includes a capacitor assembly 30, a power module assembly 38, and a power busbar assembly 34 that electrically couples these modules together by providing a conductive path between their various input and/or output terminals. Capacitor assembly 30 is a bipolar or two-terminal (positive and negative terminal) device, and may include an array of any number of individual bipolar capacitors 33 (or capacitor bobbins), contained within a housing 42. Housing 42 may be constructed of any durable and electrically insulating material which provides capacitors and associated electrical connections protection from road debris and environmental ingressions. Capacitor assembly 30 also includes a U-shaped capacitor busbar assembly 46 formed as a laminar structure that has a first positive busbar 44 and a first negative busbar 48. These busbars together straddle the capacitor array of assembly 30 providing electrical coupling to positive and negative terminals, respectively, of individual capacitors 33 therein.

Power busbar assembly 34 has a laminar and substantially planar structure and includes a second positive busbar 74 overlapping with a second negative busbar 76. Positive and negative busbars of power and capacitor busbar assemblies 34 and 46 each comprise a layer of a conducting material such as, for example, copper or tin-plated copper, each busbar layer electrically isolated from the other busbar by an interposed insulating layer. The two busbar layers, in conjunction with the insulating layer, form a laminar structure for each assembly. Second positive and negative busbars 74 and 76 are coupled in electrical continuity with first positive and negative busbars 44 and 48, respectively, using a plurality of electrically conductive threaded studs 94 that, when tightened with an associated conductive nut (not shown), also mechanically clamp busbar assemblies 34 and 46 together. Each individual stud provides a conductive pathway between busbars of one polarity, but is isolated from the opposite polarity to avoid electrical shorting. Second positive and negative busbars 74 and 76, respectively, may also be coupled to the terminals of a second two-terminal device such as, for example, a DC source battery 22. Battery 22 provides a DC voltage bias via electrical coupling with power busbar assembly 34 that is transferred to other interconnected two-terminal devices such as capacitor assembly 30 and power module assembly 38.

Power module assembly 38 may have any number of individual power modules, each module configured with two input terminals for receiving a DC input signal, and a single output terminal for providing a single-phase AC output signal. Assembly 38 may thereby provide a multi-phase AC output depending upon the number of individual power modules used. As shown in FIG. 2, power module assembly 38 comprises three power modules 55-57, each module electrically coupled to power busbar assembly 34 using connector assemblies 100-102, respectively, to be described in further detail below. Power modules 55-57 are each populated with a plurality of semiconductor-based power diode and switching devices including at least one IGBT (Insulated Gate Bipolar Transistor) 60 coupled to at least one accompanying power diode 64. Each power module converts a DC input signal received through an associated connector assembly to a single-phase, AC output signal that may be phase-adjusted so that, as shown, the combined output of modules 55-57 may comprise three complimentary AC phases.

Each of connector assemblies 100-102 is electrically coupled to power busbar assembly 34 and is configured to provide electrically separate conductive pathways between second positive and negative busbars 74 and 76 and input contacts of like polarity on an associated power module. Because the electrical and mechanical integration is the same for each connector assembly/power module pairing, only the integration between power module 55 and connector assembly 100 will be described in detail. Referring to FIG. 2, a DC input bias originating from DC battery 22 and modifiable by an output signal from capacitor assembly 30, is transferred through second positive and negative busbars 74 and 76 and connector assembly 100 to power module 55. Connector assembly 100 is secured to both of these busbars along a leading edge 73 of power busbar assembly 34 using a single fastener 104 in a manner that maintains electrical isolation between positively and negatively biased components. During operation, power module 55 generates a single-phase AC output transferable through an output contact 61. These signals are combined with similar signals from output contacts 63 and 65 of power modules 56 and 57, respectively, to provide 3-phase AC power.

Figure 3:
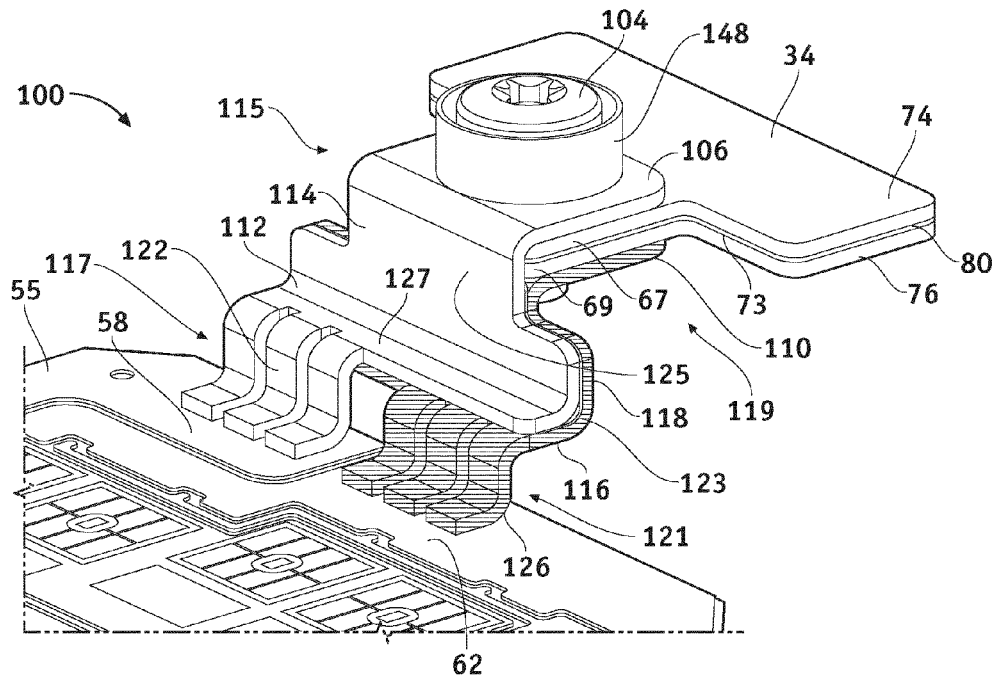
FIG. 3 is a isometric view of an exemplary connector assembly for use with the power inverter assembly depicted in FIG. 2.

FIG. 3 is an isometric diagram illustrating a manner in which connector assembly 100 is integrated between power module 55 and power busbar assembly 34 in accordance with another exemplary embodiment. Power busbar assembly 34 includes positive and negative busbars 74 and 76, respectively, electrically isolated from each other by an interposed insulating layer 80 to form a laminar structure. Insulating layer 80 may comprise any suitable insulating material such as a powder coating that each of busbars 74 and 76 may be individually coated with prior to forming the laminate. Alternatively as shown, insulating layer 80 may comprise a sheet of insulating material such as Mylar®. Second positive busbar 74 has an integrally formed positive terminal tab 67 that extends outward from leading edge 73 of power busbar assembly 34. Second negative busbar 76 similarly has an integrally formed negative terminal tab 69 extending from leading edge 73 that overlaps positive terminal tab 67. Insulator layer 80 also extends beyond leading edge 73 and electrically separates terminal tabs 67 and 69 from each other. Together, tabs 67 and 69 and insulating layer 80 form a laminar, tab-shaped fixture whereon accessories to power busbar assembly 34 such as a connector assembly for a power module may be conveniently connected. In one embodiment, tabs 67 and 69 are each substantially coplanar with power busbar assembly 34. Terminal tabs 67 and 69 and insulating layer 80 each have substantially aligned openings (shown in FIG. 5) that accommodate coupling to connector assembly 100 using fastener 104. Connector assembly 100 includes a bridge electrode 112 that electrically couples terminal tab 67 with input contact 58, and a bridge electrode 116 that similarly electrically couples terminal tab 69 with input contact 62. Bridge electrodes are constructed from an electrically conductive material such as, for example copper or tin-plated copper, and are electrically isolated from each other by an insulating layer 123 disposed between them. Insulating layer 123 may include any suitable non-conducting material such as a powder coating or Mylar® sheet.

Bridge electrode 112 includes a connecting tab 106 proximate a first end 115 coupled to an end terminal 122 proximate a second end 117 via a center member 114. In one embodiment, connecting tab 106, center member 114, and end terminal 122 are integrally formed together into a single piece. Connecting tab 106 overlaps terminal tabs 67 and 69 and is coupled to positive terminal tab 67 by fastener 104. In one embodiment, connecting tab 106 and end terminal 122 are both substantially orthogonal to center member 114. In another embodiment, center member 114 has a first portion 125 integrally formed with and substantially orthogonal to a second portion 127. In another embodiment, first portion 125 is substantially orthogonal to and integrally formed with connecting tab 106. In yet another embodiment, connecting tab 106 and second portion 127 are substantially parallel to each other and are separated from each other by first portion 125. In yet another embodiment, second portion 127 is substantially orthogonal to and integrally formed with end terminal 122. End terminal 122 is coupled to input contact 58 using any suitable method that provides electrical continuity such as by soldering or ultrasonic welding.

Bridge electrode 116 includes a connecting tab 110 proximate a first end 119 coupled to an end terminal 126 proximate a second end 121 via a center member 118. In one embodiment, connecting tab 110, center member 118, and end terminal 126 are integrally formed together into a single piece. Connecting tab 110 overlaps terminal tabs 67 and 69 and is coupled to terminal tab 69 using fastener 104. End terminal 126 is electrically coupled to input contact 62 in the manner described above with reference to end terminal 122 and contact 58. Connecting tabs 106 and 110 and terminal tabs 67 and 69 together form a 4-member overlapping stack mechanically secured by fastener 104. When fastened to positive and negative terminal tabs 67 and 69, bridge electrodes 112 and 116 are each aligned as shown with center members 114 and 118 substantially overlapping each other. This stacked configuration combined with the substantial overlapping of center members 114 and 118 provides current pathways between busbars 74 and 76 and power module input contacts 58 and 62, respectively, that substantially overlap and reduce inductance thereby. Such a configuration also enables the use of a single fastener to secure connector assembly 100 to power busbar assembly 34, reducing part count and simplifying assembly. As will be described in greater detail below, positive and negative components of connector assembly 100 including components of fastener 104 are maintained in electrical isolation by gaps and/or insulating elements that optionally include an insulating shroud 148.

Figure 4:
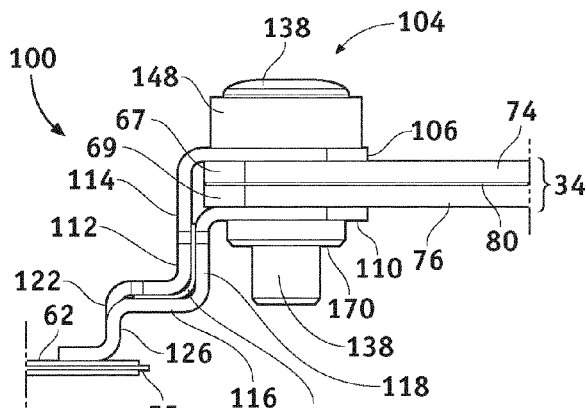
FIG. 4 is an end view of the connector assembly depicted in FIG. 3.

FIG. 4 is an end view illustrating a manner in which connector assembly 100 is integrated with positive and negative terminal tabs 67 and 69 and power module 55 in accordance with an exemplary embodiment. Terminal tabs 67 and 69 are each integrally formed with second positive and negative busbars 74 and 76, respectively, and are separated from each other by insulating layer 80 interposed therebetween forming a laminar structure. Connector assembly 100 includes bridge electrode 112 coupled between terminal tab 67 and input contact 58 (FIG. 3) of power module 55, and bridge electrode 116 coupled between terminal tab 69 and input contact 62. Bridge electrode 112 includes connecting tab 106 and end terminal 122, these elements coupled together and separated by center member 114. In one embodiment, connecting tab 106, center member 114, and end terminal 122 are integrally formed as one piece. Bridge electrode 116 similarly includes connecting tab 110 coupled to end terminal 126 via center member 118. Center members 114 and 118 substantially overlap each other and are electrically separated by insulating layer 123. Connecting tab 106 is electrically coupled to positive terminal tab 67, and overlaps with positive and negative terminal tabs 67 and 69, and connecting tab 110. Connecting tab 110 is electrically coupled to negative terminal tab 69, and overlaps each of positive and negative terminal tabs 67 and 69, and connecting tab 106. The resulting 4-member overlapping stack is clamped together by fastener 104 including bolt 138 that passes through openings in each member of the stack and is tightened by conductive nut 170. Conductive nut 170 is mechanically and electrically coupled to connecting tab 110 and, when tightened, holds tab 110 in electrical contact with negative terminal tab 69. Fastener 104 may also include other connecting and/or insulating elements such as a washer (shown in FIG. 5) and insulating shroud 148 described in further detail below.

During operation, current flows through positive terminal tab 67 entering bridge electrode 112 through connecting tab 106, and flows through center member 114 and end terminal 122 to input contact 58 (FIG. 3). In a similar manner, current flows through terminal tab 69 to input contact 62 through connecting tab 110, center member 118, and end terminal 126 of bridge electrode 116. The substantial overlapping of connecting tabs 106 and 110 with positive and negative terminal tabs 67 and 69, combined with overlapping between center members 114 with 118 reduces the inductance of connector assembly 100. Further, the overlapped configuration of connecting and terminal tabs enables these tabs to be secured with a single fastener, reducing part count thereby.

Figure 5:
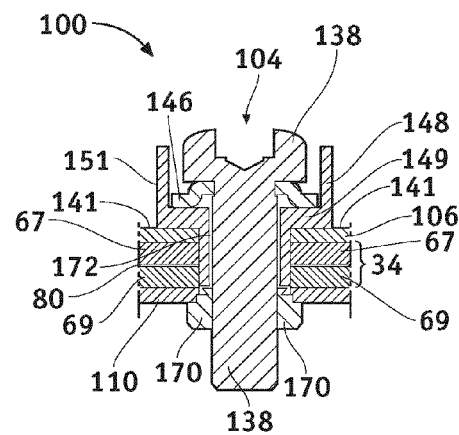
FIG. 5 is a cross-sectional illustration of the connector assembly depicted in FIGS. 3 and 4.

FIG. 5 illustrates, in cross-section, a manner in which connecting tabs 106 and 110 are fastened to positive and negative terminal tabs 67 and 69 in accordance with an exemplary embodiment. Connecting tabs 106 and 110 overlap with terminal tabs 67 and 69 forming a 4-member stack, with connecting tab 106 in electrical contact with terminal tab 67, and connecting tab 110 in electrical contact with terminal tab 69. Tabs 67, 69, 106, and 110 are secured by fastener 104 that includes bolt 138, a locking washer 146, conducting nut 170, and optionally includes insulating shroud 148. Conducting nut 170 preferably is constructed of any suitable conducting material and may be configured to mechanically interlock with connecting tab 110 as shown in FIG. 5, to enhance mechanical and electrical coupling therebetween. Bolt 138 threads into nut 170 and is centered thereby through an opening 172 formed through each of tabs 67, 69, 106, and 110 and insulating layer 80. Opening 172 may be sized accordingly to prevent bolt 138 from shorting to positive terminal tab 67 and/or connecting tab 106. In one embodiment illustrated in FIG. 5, insulating shroud 148 circumferentially shields bolt 138 within opening 172, preventing electrical contact/shorting with terminal tab 67 and/or connecting tab 106. Insulating shroud 148 may be constructed of any suitable insulating material such as a thermoplastic polymer. Shroud 148 has a horizontal shoulder 149 that rests on an outer surface 141 of connecting tab 106 proximate to opening 172 and provides a contacting surface whereon the head of bolt 138 or, as shown, locking washer 146 may reside when fastener 104 is tightened. Insulating shroud 148 may also have a vertical member 151 that circumferentially shields the head of bolt 138 and provides further electrical insulation thereby. Those of skill in the art will appreciate that while insulating shroud 148 is illustrated as having a particular configuration, many other possible configurations for an insulating shroud exist that may prevent shorting between elements of fastener 104 and associated connecting/terminal tabs.

In another embodiment (not illustrated), insulating shroud 148 is not used and locking washer 146 directly engages the surface of connecting tab 106 when fastener 104 is tightened. In this case, locking washer 146 may be constructed of a non-conducting material to provide electrical insulation between bolt 138 and connecting tab 106. In a further embodiment, a suitable moldable insulating polymeric material such as, for example, a powder coating (not shown), may be inserted into the gaps created between connecting and terminal tabs and bolt 138 to provide further electrical insulation. In a further embodiment, outer surface 141 of connecting tab 106 may be electrically insulated from washer 146 by a suitable non-conducting coating (not shown). In this case, washer 146 may be constructed of a conducting material such as steel or stainless steel.

Accordingly, the various embodiments of the present invention described herein provide a low inductance connector assembly for a busbar system. The busbar system including connector assemblies interconnects the various input and output terminals of one or more two-terminal devices such as a capacitor assembly and/or a DC source, to the input contacts of another multi-terminal device such as a power module from a power module assembly. The connector assembly electrically couples laminar and overlapping positive and negative output terminals from a primary busbar to input contacting terminals of the power module. The assembly includes a pair of conductive, and electrically segregated bridge electrodes, each electrode configured to form a current pathway between a busbar terminal, that may be conveniently tab-shaped, and a power module input contact. Connecting tabs from each bridge electrode overlap each other and both busbar terminals forming a single, 4-member, overlapping stack. The stack is mechanically secured with a single fastener that may include an accompanying insulating shroud and/or other insulating features to prevent shorting. Each bridge electrode also includes an end terminal electrically coupled to a power module input contact and a center member integrally formed between the end terminal and the connecting tab. The center members of each bridge electrode are configured to substantially overlap each other when the bridge electrodes are fastened to busbar terminals. The overlapping stacked junction of terminals and connecting tabs enables the use of a single fastener to connect both bridge electrodes to the primary busbar, reducing part count and simplifying assembly thereby. Further, such junction overlap combined with overlap of bridge electrode center members reduces system inductance by extending the overlap of current pathways beyond primary busbars up to power module connecting terminals.

The preceding description refers to elements or nodes or features being "connected" or "coupled" together. As used herein, unless expressly stated otherwise, "connected" means that one element/node/feature is directly joined to (or directly communicates with) another element, node or other feature in a mechanical, logical, electrical or other appropriate sense. Likewise, unless expressly stated otherwise, "coupled" means that one element/node/feature is directly or indirectly joined to (or directly or indirectly communicates with) another element/node/feature in a mechanical, logical, electrical or other appropriate sense. The term "exemplary" is used in the sense of "example," rather than "model." Further, although the figures may depict example arrangements of elements, additional intervening elements, devices, features, or components may be present in a practical embodiment of the invention. Furthermore, the term "integrally formed" means that a first element/node/feature extends or transitions in a continuous manner from a second element/node/feature and not as two separate and distinguishable elements.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A vehicular power inverter assembly for deployment on a vehicle including an electric motor and a vehicle battery, the assembly comprising:
   a busbar assembly, comprising:
      a first busbar having a first terminal;
      a second busbar having a second terminal substantially overlapping with the first terminal;
      a first bridge electrode having a first tab electrically coupled to the first terminal; and
      a second bridge electrode having a second tab electrically coupled to the second terminal and substantially overlapping the first and second terminals; and a vehicular power module electrically coupled to the first bridge electrode and to the second bridge electrode, the vehicular power module configured to convert a direct current received from the vehicle battery through the busbar assembly to an alternating current to drive the electric motor.

2. An assembly according to claim 1, wherein the first bridge electrode further comprises:
a first end terminal electrically coupled to the vehicular power module; and
a first member coupled between the first tab and the first end terminal; and
wherein the second bridge electrode further comprises:
a second end terminal electrically coupled to the vehicular power module; and
a second member coupled between the second tab and the second end terminal, the first and second members substantially overlapping each other.

3. An assembly according to claim 2, wherein the first tab, the first end terminal, and the first member integrally formed.

4. An assembly according to claim 2, further comprising an insulating layer interposed between the first member and the second member.

5. An assembly according to claim 2, wherein the first tab and the first member are substantially orthogonal to each other.

6. An assembly according to claim 2, wherein the first member is substantially orthogonal to the first end terminal.

7. An assembly according to claim 2, wherein the first member further comprises a first portion integrally formed with the first tab, and a second portion integrally formed with the first terminal end and the first portion, and disposed therebetween, and wherein the first portion is substantially orthogonal to the second portion.

8. An assembly according to claim 7, wherein the second portion is substantially parallel to the first tab, and the second portion and the first tab are separated by the first portion.

9. An assembly according to claim 1, further comprising a fastener disposed through the first tab, the second tab, the first terminal, and the second terminal, the fastener electrically insulated from the first terminal and the first tab.

10. An assembly according to claim 1, wherein the first busbar further comprises a leading edge, and wherein the first terminal extends beyond the leading edge.

11. An assembly according to claim 10, wherein the first terminal tab and the first busbar are substantially coplanar with each other.

12. A vehicular power inverter assembly for deployment on a vehicle including an electric motor and a vehicle battery, the assembly comprising:
a plurality of busbars configured to be electrically coupled to the battery and having a plurality of substantially overlapping terminal tabs;
a first bridge electrode having a first connecting tab overlapping the plurality of substantially overlapping terminal tabs
a second bridge electrode having a second connecting tab overlapping the plurality of substantially overlapping terminal tabs and the first connecting;
a capacitor assembly adjacent the plurality of busbars and electrically coupled thereto; and
a vehicular power module electrically coupled to the first bridge electrode and to the second bridge electrode, the vehicular power module configured to convert a direct current received from the vehicle battery through the busbar assembly to an alternating current to drive the electric motor.

13. An assembly according to claim 12, wherein the first bridge electrode further comprises a first member, and wherein the second bridge electrode further comprises a second member overlapping the first member.

14. An assembly according to claim 13, further comprising an insulating layer interposed between the first and second members.

15. An assembly according to claim 13, wherein the first member and the first connecting tab are integrally formed.

16. An assembly according to claim 13, wherein the first member and the second connecting tab are integrally formed.

17. An assembly according to claim 13, wherein the first member further comprises a first portion and a second portion, and wherein the first and second portions are orthogonal to each other.

18. An assembly according to claim 13 further comprising a fastener disposed through the first connecting tab, the second connecting tab, the first terminal tab, and the second terminal tab.

19. An assembly according to claim 18, wherein the fastener electrically couples the first connecting tab to the first end terminal and electrically couples the second connecting tab to the second end terminal.

* * * * *